United States Patent [19]
Cox et al.

[11] Patent Number: 6,117,344
[45] Date of Patent: Sep. 12, 2000

[54] METHOD FOR MANUFACTURING LOW WORK FUNCTION SURFACES

[75] Inventors: Isaiah Watas Cox, London, United Kingdom; Avto Tavkhelidze, Tbilsi, Georgia; Jonathan Sidney Edelson, Hillsboro, Oreg.; Stuart Harbron, Berkhamsted, United Kingdom

[73] Assignee: Borealis Technical Limited, London, United Kingdom

[21] Appl. No.: 09/045,299

[22] Filed: Mar. 20, 1998

[51] Int. Cl.[7] .................................. G25F 3/02
[52] U.S. Cl. ..................... 216/11; 216/40; 216/54; 216/66; 216/67; 430/199; 430/296; 430/302; 430/310
[58] Field of Search ................ 430/199, 291, 430/296, 300, 302, 309, 310, 311, 313, 322, 323, 324, 325; 216/11, 13, 40, 52, 54, 66, 67

[56] References Cited

U.S. PATENT DOCUMENTS

| | | |
|---|---|---|
| 4,686,162 | 8/1987 | Stangl et al. ............................ 430/5 |
| 5,119,151 | 6/1992 | Onda ...................................... 257/14 |
| 5,229,320 | 7/1993 | Ugajin .................................... 438/694 |
| 5,233,205 | 8/1993 | Usagawa et al. . |
| 5,247,223 | 9/1993 | Mori et al. . |
| 5,332,952 | 7/1994 | Ugajin et al. . |
| 5,371,388 | 12/1994 | Oda . |
| 5,521,735 | 5/1996 | Shimizu et al. . |
| 5,579,232 | 11/1996 | Tong et al. . |
| 5,722,242 | 3/1998 | Edelson . |
| 5,772,905 | 6/1998 | Chou ....................................... 216/44 |

FOREIGN PATENT DOCUMENTS 4080964A  3/1992  Japan ......................... H01L 29/28

OTHER PUBLICATIONS

Chou et al., Imprint Lithography with 25 Namometer Resolution, Science vol. 272, pp. 85–87, Apr. 5, 1996.
Electronic Engineering Times, Feb. 23, 1998, pp. 43 and following.

*Primary Examiner*—Randy Gulakowski
*Assistant Examiner*—Allan Olsen

[57] ABSTRACT

Methods for fabricating nano-structured surfaces having geometries in which the passage of elementary particles through a potential barrier is enhanced are described. The methods use combinations of electron beam lithography, lift-off, and rolling, imprinting or stamping processes.

20 Claims, 8 Drawing Sheets

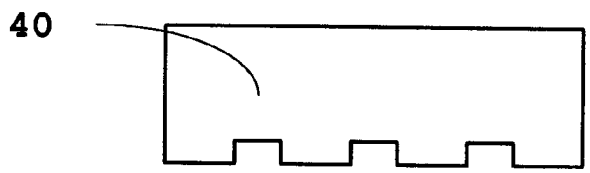
Figure 8(a)
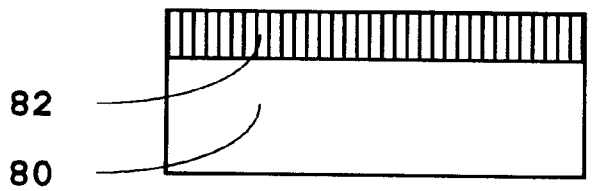
Figure 8(b)
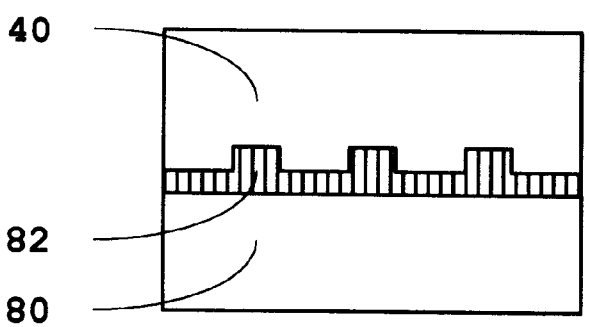
Figure 8(c)
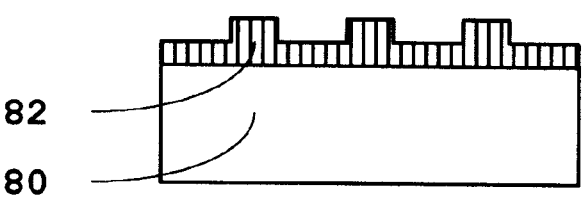
Figure 8(d)
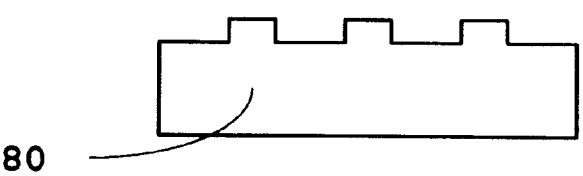

METHOD FOR MANUFACTURING LOW WORK FUNCTION SURFACES

CROSS-REFERENCE TO RELATED INVENTION

The present invention is related to U.S. patent application Ser. No. 09/020,654, filed Feb. 9, 1998, entitled "Method for Increasing Tunneling through a Potential Barrier", which is incorporated herein by reference in its entirety.

FIELD OF THE INVENTION

The present invention is concerned with methods for fabricating elementary particle-emitting surfaces, which could be used as cathodes or anodes, and embodiments of the same.

BACKGROUND: VACUUM DIODES AND THERMIONIC DEVICES

In Edelson's disclosure, filed 1995 March 7, titled "Electrostatic Heat Pump Device and Method", Ser. No. 08/401,038, incorporated herein by reference in its entirety, two porous electrodes were separated by a porous insulating material to form an electrostatic heat pump. In said device, evaporation and ionization of a working fluid in an electric field provided the heat pumping capacity. The use of electrons as the working fluid is disclosed in that application. In Edelson's subsequent disclosure, filed Jul. 5, 1995, titled "Method and Apparatus for Vacuum Diode Heat Pump", Ser. No. 08/498,199, an improved device and method for the use of electrons as the working fluid in a heat pumping device is disclosed. In this invention, a vacuum diode is constructed using a low work function cathode.

In Edelson's further subsequent disclosure, filed Dec. 15, 1995 titled "Method and Apparatus for Improved Vacuum Diode Heat Pump", Ser. No. 08/573,074, incorporated herein by reference in its entirety, the work function of the anode was specified as being lower than the work function of the cathode in order to optimize efficient operation.

In a yet further subsequent disclosure, filed Dec, 27, 1995 titled "Method and Apparatus for a Vacuum Diode Heat Pump With Thin Film Ablated Diamond Field Emission", Ser. No. 08/580,282, incorporated herein by reference in its entirety, Cox and Edelson disclose an improvement to the Vacuum Diode Heat Pump, wherein a particular material and means of construction was disclosed to further improve upon previous methods and devices.

The Vacuum Diode at the heart of Edelson's Vacuum Diode Heat Pump may also be used as a thermionic generator: the differences between the two devices being in the operation of the diode, the types and quantities of external energy applied to it, and the provisions made for drawing off, in the instance of the thermionic converter, an electrical current, and in the instance of the Vacuum Diode Heat Pump, energy in the form of heat.

In Cox's disclosure, filed Mar. 6, 1996 titled "Method and Apparatus for a Vacuum Thermionic Converter with Thin Film Carbonaceous Field Emission", Ser. No. 08/610,599, incorporated herein by reference in its entirety, a Vacuum Diode is constructed in which the electrodes of the Vacuum Diode are coated with a thin film of diamond-like carbonaceous material. A Vacuum Thermionic Converter is optimized for the most efficient generation of electricity by utilizing a cathode and anode of very low work function. The relationship of the work functions of cathode and anode are shown to be optimized when the cathode work function is the minimum value required to maintain current density saturation at the desired temperature, while the anode's work function is as low as possible, and in any case lower than the cathode's work function. When this relationship is obtained, the efficiency of the original device is improved.

Many attempts have been made to find materials with low work function for use as cathodes. Uses for such materials include amplifiers, vacuum diodes, flat panel displays, thermionic energy converters, and now thermionic heat pumps.

BACKGROUND: QUANTUM MECHANICS AND DE BROGLIE WAVE

It is well known from Quantum Mechanics that elementary particles have wave properties as well as corpuscular properties. The probability of finding an elementary particle at a given location is $|\psi|^2$ where $\psi$ is a complex wave function and has form of the de Broglie wave:

$$\psi = A\exp[(-i2\pi/h)(Et - pr)] \quad (1)$$

Here $\psi$ is wave function; h is Planck's constant; E is energy of particle; p is impulse of particle; r is a vector connecting initial and final locations; t is time.

There are well known fundamental relationships between the parameters of this probability wave and the energy and impulse of the particle:

$$E \text{ is electron energy and } p = (h/2\pi)k \quad (2)$$

Here k is the wave number of probability wave. The de Broglie wavelength is given by:

$$\lambda = 2\pi/k \quad (3)$$

If time, t, is set to 0, the space distribution of the probability wave may be obtained. Substituting (2) into (1) gives:

$$\psi = A \exp(ikr) \quad (4)$$

FIG. 1 shows an elementary particle wave moving from left to right perpendicular to a surface 7 dividing two domains. The surface is associated with a potential barrier, which means the potential energy of the particle changes it passes through it.

Incident wave 1 Aexp(ikx) moving towards the border will mainly reflect back as reflected wave 3 βAexp(−ikx), and only a small part leaks through the surface to give transmitted wave 5 α(x)Aexp(ikx) (β≈1>>α). This is the well-known effect known as quantum mechanical tunneling. The elementary particle will pass the potential energy barrier with a low probability, depending on the potential energy barrier height.

BACKGROUND: ELECTRON INTERFERENCE

Usagawa in U.S. Pat. No. 5,233,205 discloses a novel semiconductor surface in which interaction between carriers such as electrons and holes in a mesoscopic region and the potential field in the mesoscopic region leads to such effects as quantum interference and resonance, with the result that output intensity may be changed. Shimizu in U.S. Pat. No. 5,521,735 discloses a novel wave combining and/or branching device and Aharanov-Bohm type quantum interference devices which have no curved waveguide, but utilize double quantum well structures.

Mori in U.S. Pat. No. 5,247,223 discloses a quantum interference semiconductor device having a cathode, an anode and a gate mounted in vacuum. Phase differences among the plurality of electron waves emitted from the cathode are controlled by the gate to give a quantum interference device operating as an AB type transistor.

Other quantum interference devices are also disclosed by Ugajin in U.S. Pat. No. 5,332,952 and Tong in U.S. Pat. No. 5,371,388.

BACKGROUND: PIEZO-ELECTRIC POSITIONING

In their U.S. patent application Ser. No. 08/924,910 filed Aug. 9, 1991 incorporated herein by reference in its entirety, Edelson and Tavkhelidze describe vacuum diode devices in which the separation of the electrodes is effected using piezo-electric positioning elements. They also teach a method for fabricating electrodes in which imperfections on one are exactly mirrored in the other, which allows electrode to be positioned very closely together.

BACKGROUND: TUNNELING THROUGH POTENTIAL BARRIERS

In U.S. patent application Ser. No. 09/020,654, filed Feb. 9, 1998 entitled "Method for Increasing Tunneling through a Potential Barrier", Tavkhelidze teaches a method for promoting the passage of elementary particles at or through a potential barrier comprising providing a potential barrier having a geometrical shape for causing de Broglie interference between said elementary particles is disclosed.

Referring now to FIG. 2, two domains are separated by a surface 17 having an indented shape, with height a.

An incident probability wave 11 is reflected from surface 17 to give reflected probability wave 13, and from the bottom of the indent to give reflected probability wave 21. The reflected probability wave will thus be:

$$A\beta\exp(-ikx)+A\beta\exp[-ik(x+2a)]=A\beta\exp(-ikx)[1+\exp(-ik2a)] \quad (5)$$

When $k2a=\pi$, $\exp(-i\pi)=-1$ and equation (5) will equal zero.

Physically this means that for $k2a=(2\pi/\lambda)2a=\pi$ and correspondingly $a=(\lambda/4)$, the reflected probability wave equals zero. Further this means that the particle will not reflect back from the border. Leakage of the probability wave through the barrier will occur with increased probability and will open many new possibilities for different practical applications.

Indents on the surface should have dimensions comparable to de Broglie wavelength of electron. In particular indent height should be $$a=n\lambda+\lambda/4 \quad (6)$$

Here n=0,1,2, etc

And the indent width should be of order of $2\lambda$.

If these requirements are satisfied then elementary particles will accumulate on the surface.

For semiconductor material, the velocities of electrons in the electron cloud is given by the Maxwell-Boltsman distribution:

$$F(v)dv=n(m/2\pi K_B T)\exp(-mv^2/2K_B T)dv \quad (7)$$

where F(v) is the probability of an electron having a velocity between v and v+dv.

The average velocity of the electrons is $$V_{av}=(3K_B T/m)^{1/2} \quad (8)$$

and the de Broglie wavelength corresponding to this velocity, calculated using formulas (2), (3) and the classical approximation p=mv is:

$$\lambda=h/(3m\,K_B T)^{1/2}=62 \text{ Å for } T=300K. \quad (9)$$

This gives a value for a of 62/4=15.5 Å. Indents of this depth may be constructed on a surface by a number of means known to the art of micro-machining. Alternatively, the indented shape may be introduced by depositing a series of islands on the surface.

For metals, free electrons are strongly coupled to each other and form a degenerate electron cloud. Pauli's exclusion principle teaches that two or more electrons may not occupy the same quantum mechanical state: their distribution is thus described by Fermi-Dirac rather than Maxwell-Boltsman. In metals, free electrons occupy all the energy levels from zero to the Fermi level ($\epsilon_f$).

Referring now to FIG. 3, electron 1 has energy below the Fermi level, and the probability of occupation of these energy states is almost constant in the range of $0-\epsilon_f$ and has a value of unity. Only in the interval of a few $K_B T$ around $\epsilon_f$ does this probability drop from 1 to 0. In other words, there are no free states below $\epsilon_f$. This quantum phenomenon leads to the formal division of free electrons into two groups: Group 1, which comprises electrons having energies below the Fermi level, and Group 2 comprising electrons with energies in the interval of few $K_B T$ around $\epsilon_f$.

For Group 1 electrons, all states having energies a little lower or higher are already occupied, which means that it is quantum mechanically forbidden for them to take part in current transport. For the same reason electrons from Group 1 cannot interact with the lattice directly because it requires energy transfer between electron and lattice, which is quantum mechanically forbidden.

Electrons from Group 2 have some empty energy states around them, and they can both transport current and exchange energy with the lattice. Thus only electrons around the Fermi level are taken into account in most cases when properties of metals are analyzed.

For electrons of group 1, two observations may be made. The first is that it is only these electrons which have wavelengths comparable to dimensions achievable by current fabrication techniques: 50–100 Å corresponds to about $0.01\epsilon_f$, ($E\sim k^2(1/\lambda)^2$) Group 2 electrons of single valence metals on the other hand, where $\epsilon_f=2-3$ eV, have a de Broglie wavelength around 5–10 Å which is difficult to fabricate using current techniques.

The second is that for quantum mechanical interference between de Broglie waves to take place, the mean free path of the electron should be large. Electrons from group 1 satisfy this requirement because they effectively have an infinite main free path because of their very weak interaction with the lattice.

Referring again to FIG. 3 electron 1, which is a group 1 electron, has $k_0=\pi/2a$ and energy $\epsilon_0$, and is moving to the indented surface 17. As discussed above, this particular electron will not reflect back from the surface due to interference of de Broglie waves, and will leave the metal. Consider further that the metal is connected to a source of electrons, which provides electron 2, having energy close to $\epsilon_f$ (group 2). As required by the thermodynamic equilibrium electron 2 will lose energy to occupy state $\epsilon_0$, losing energy $\epsilon_f-\epsilon_0$, for example by emission of a photon with energy $\epsilon_p$ ($\epsilon_f-\epsilon_0$). If this is absorbed by electron 3, electron 3 will be excited to a state having energy $\epsilon_f+\epsilon_p=2\epsilon_f-\epsilon_0$.

Thus as a consequence of the loss of electron 1, electron 3 from the Fermi level is excited to a state having energy $2\epsilon_f-\epsilon_0$, and could be emitted from the surface by thermionic emission. The effective work function of electron 3 is reduced from the value of $\phi$ to $\phi-\epsilon_f+\epsilon_0=\phi-(\epsilon_f-\epsilon_0)$. In another words, the work function of electron 3 is reduced by $\epsilon_f-\epsilon_0$.

Thus indents on the surface of the metal not only allow electron 1 to be emitted into the vacuum with high probability by interference of the de Broglie wave, but also results in the enhanced probability of another electron (electron 3) by ordinary thermionic emission.

This approach will decrease the effective potential barrier between metal and vacuum (the work function).

This approach has many applications, including cathodes for vacuum tubes, thermionic converters, vacuum diode heat pumps, photoelectric converters, cold cathode sources, and many other in which electron emission from the surface is used.

In addition, an electron moving from vacuum into an anode electrode having an indented surface will also experience de Broglie interference, which will promote the movement of said electron into said electrode, thereby increasing the performance of the anode.

BACKGROUND: NANO-FABRICATION AND ELECTRON-BEAM ETCHING

Electronic Engineering Times Feb. 23, 1998 page 43 and following reports that several groups have reported approaches to building single-electron memory cells where the active region is measured in nanometers rather than microns. These new devices are based on silicon and operate at room temperature. Stephen Chou has devised a process called nano-imprint lithography which offers the possibility of sub 0.1-micron circuit fabrication. Three fundamental approaches are being adopted: micromechanical manipulation based on scanning-probe microscopy, chemical self assembly and electron beam patterning.

Scanning-probe techniques are able to move and position individual atoms on a substrate. Noel MacDonald and Calvin Quate have extended this to probe-array technology allowing positioning operations to be conducted in parallel. Other molecular self-assembly techniques have shown the ability to quickly define or assemble regular arrays. However, for the methods to yield a practical circuit fabrication technique, some way must be found to create arbitrary circuit patterns under a designer's direction. Direct patterning of a conjugated polymer by exposing thin films of the material with a 50 kV electron beam is one approach. This modifies the molecular structure of parts of a special polymer spin-coated onto a wafer. The polymer is then developed in a solution that dissolves either the modified or the unmodified molecules, leaving a wafer with a patterned plastic surface. The pattern may then be transferred to the wafer by an etching process. Often the polymer resists the etching process, hence etching will affect only the exposed areas of the wafer. Alternatively, the polymer is etchable, and since it comprises an additional layer on the wafer, a constant-rate etch process will remove the exposed areas of the wafer before the areas covered with the polymer, thereby transferring the pattern to the wafer.

Stephen Chou and others are developing an electron beam approach applicable to mass production. A mold or stamper, produced as described above, is used to imprint a pattern into a polymer which has been spin-coated onto a wafer. The resulting variation in thickness means that a constant rate etch process will remove the shallow areas first, leaving a pattern of exposed substrate which can be processed further.

BRIEF DESCRIPTION OF THE INVENTION

Broadly the present invention is a method for fabricating surface structures which enhance the passage of elementary particles through a potential energy barrier by utilizing interference of de Broglie waves to increase the probability of emission. In U.S. patent application Ser. No. 09/020,654, filed Feb. 9, 1998 entitled "Method for Increasing Tunneling through a Potential Barrier", Tavkhelidze describes a particular surface structure and a number of methods of producing same; the present specification describes additional methods of producing the surface described by Tavkhelidze.

In a preferred embodiment, the surface structure is created using electron beam lithography followed by etching or lift-off processes. Other embodiments include the use of oxygen atom beams to selectively oxidize the surface of a metal.

In a particularly preferred embodiment, the surface structure is mass-produced by using a replica surface, which is stamped into a resist layer. Constant rate etching techniques result in the facile and economic production of the nano-structured surfaces. In a further preferred embodiment, a "negative", or relief, of the surface required is created according to the above embodiments and used to mass-produce the surface structure in a softer material by a stamping, printing or rolling process.

OBJECTS AND ADVANTAGES

Objects of the present invention are, therefore, to provide new and improved methods and for fabricating particle-emitting surfaces having a geometrical shape for causing de Broglie interference, which have one or more of the following objects or advantages:

An object of the present invention is to provide a method for fabricating a surface having indents, the depth of which are chosen so that the probability wave of the elementary particle reflected from the bottom of the indent interferes destructively with the probability wave of the elementary particle reflected from said surface adjacent to the indents.

An advantage of the present invention is that a finely-structured surface is produced.

An advantage of the present invention is that an indented surface is produced having a lower effective work function than the unmodified surface.

An object of the present invention is to provide a method for fabricating molds, stampers or rollers which carry the geometrical shape need to cause de Broglie interference in relief, or "negative" form.

An advantage of the present invention is that the nano-structured surfaces may be easily and economically mass-produced.

BRIEF DESCRIPTION OF DRAWINGS

FIG. 8 (a–d) is a diagrammatic representation of a mass-production, stamper-based approach to the manufacture of a low work function surface.

REFERENCE NUMERALS IN THE DRAWINGS

Figure 1:
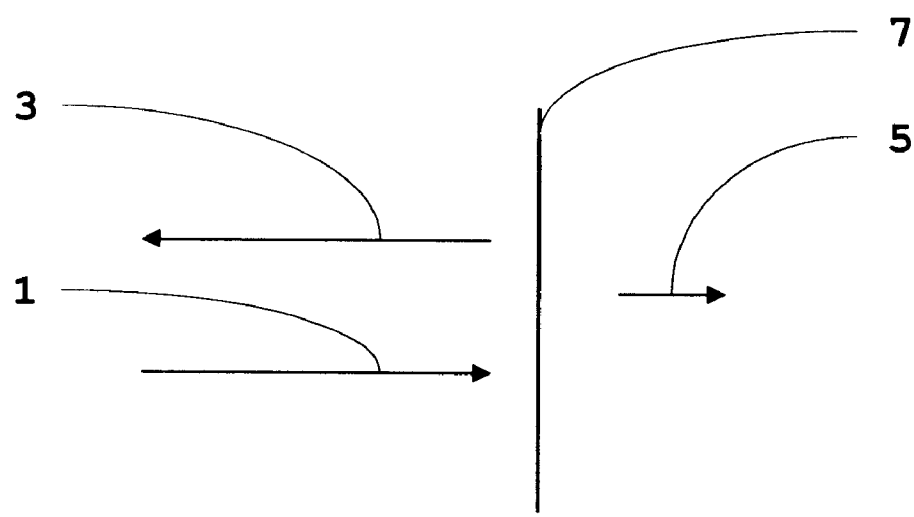
FIG. 1 shows in diagrammatic form, an incident probability wave, a reflected probability wave and a transmitted probability wave interacting with a substantially planar surface.
Figure 2:
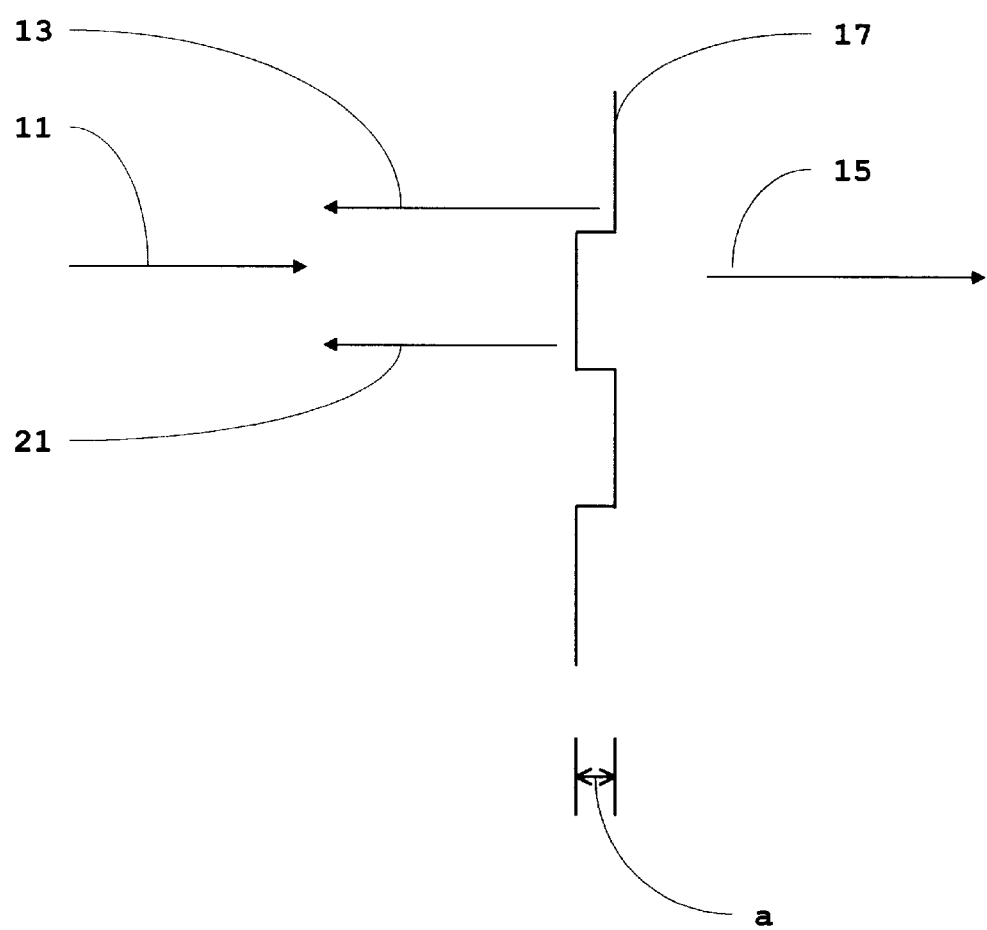
FIG. 2 shows in diagrammatic form, an incident probability wave, two reflected probability waves and a transmitted probability wave interacting with a surface having a series of indents.
Figure 3:
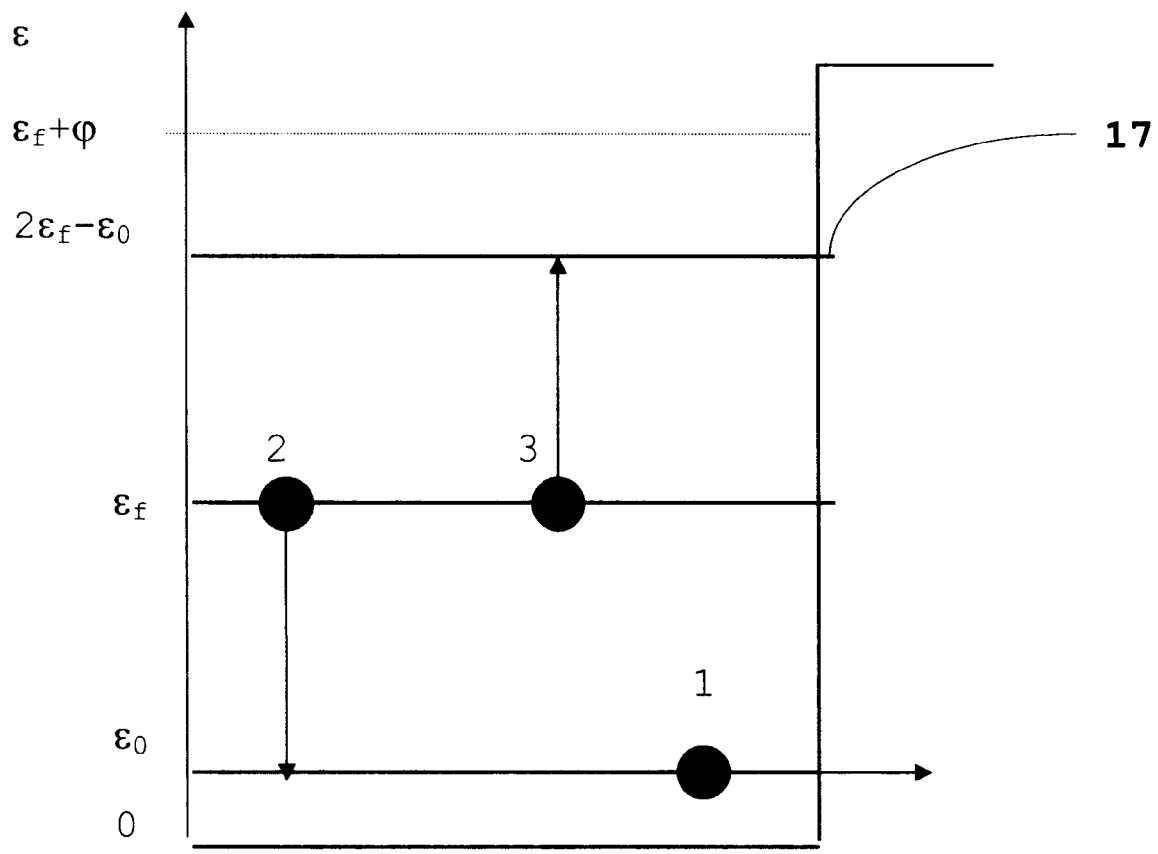
FIG. 3 shows in a diagrammatic form, the behavior of an electron in a metal
Figure 4A:
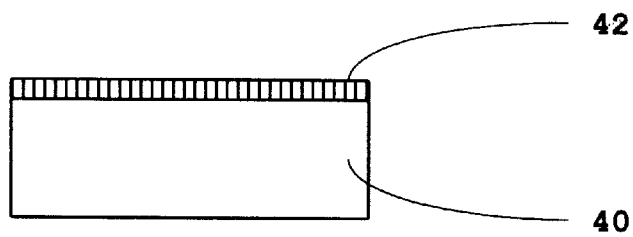
FIG. 4 (a–e) is a diagrammatic representation of an electron beam lithographic approach to the manufacture of a low work function surface.
Figure 4B:
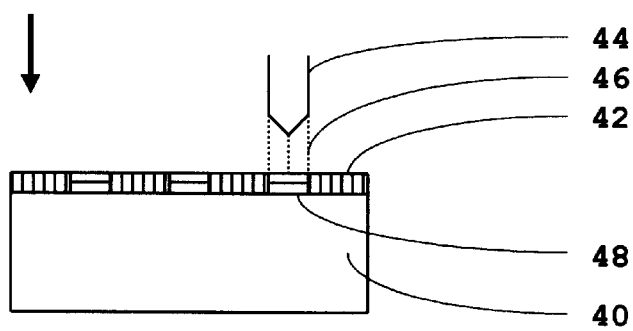
Figure 4C:
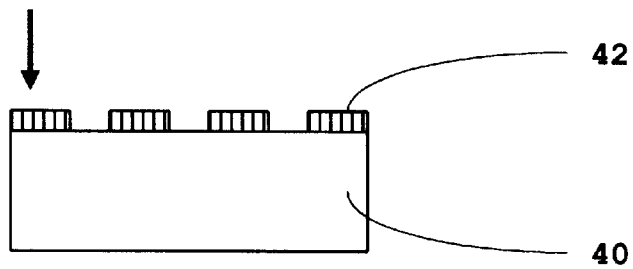
Figure 4D:
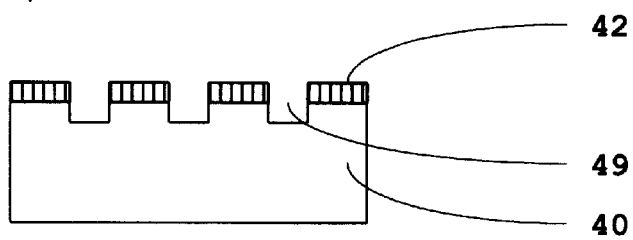
Figure 4E:
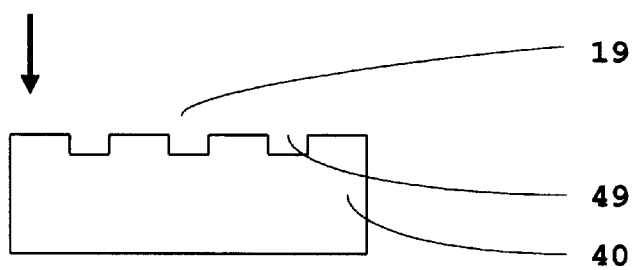

11. Incident probability wave
13. Reflected probability wave
15. Transmitted probability wave
17. Surface
19. Indented surface
21. Reflected probability wave
40. Substrate
42. Resist layer
44. Electron source
46. Electron beam
48. Modified resist
49. Pit
50. Substrate
52. Resist
54. Vacuum-deposited material
56. Raised area of material
60. Metal substrate
62. Oxide layer
64. Pit
66. Oxygen atom source
68. Oxygen atom beam
70. Metal substrate
72. Oxide layer
74. Indented oxide region
80. Substrate
82. Resist layer

DETAILED DESCRIPTION OF THE INVENTION

Referring now to FIG. 4, which shows in diagrammatic form a preferred process for making an elementary particle emitting surface having a geometrical shape for causing de Broglie interference, a substrate 40 is coated with a thin layer of resist 42 (step (a)). In a preferred embodiment, the surface is coated with a layer of resist of between 10 nm and 2 microns thickness by spin-coating and baking. In step (b), a pattern is "written" onto the surface of resist 48 by means of electron beam 46 emitted by an electron source 44, a process well-known in the art as electron beam lithography. This process changes the physical properties of resist 42, forming areas 48 which may be soluble or insoluble in an appropriate developer. In step (c) the resist-coated substrate is treated with a developing agent. In one embodiment, exposed areas 48 are soluble, and the developer removes that part of the resist exposed to the electron beam. In step (d) substrate 40 having a pattern of resist 42 on its surface, is exposed to an etching agent which etches exposed areas of the substrate, to form a series of pits 49. In step (e), the resist 42 is removed to give a substrate, whose surface is patterned with a series of pits 49 giving the surface a geometrical shape which causes de Broglie interference. In a preferred embodiment, the substrate is silica. In another preferred embodiment, the substrate is diamond. In yet another embodiment, the substrate is gallium arsenide (GaAs).

Figure 5A:
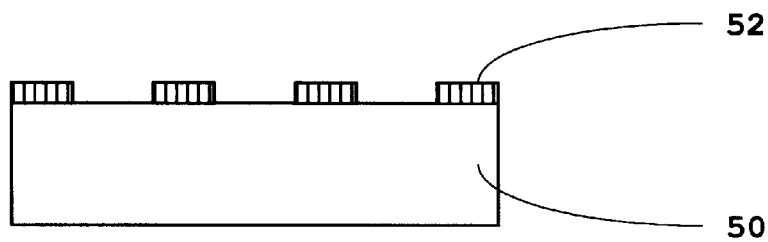
FIG. 5 (a–c) is a diagrammatic representation of a lift off approach to the manufacture of a low work function surface.
Figure 5B:
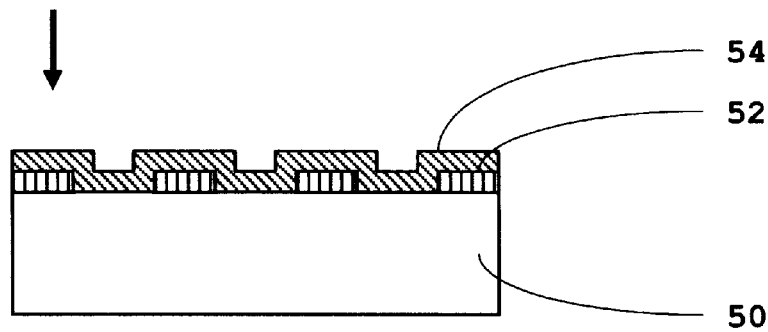
Figure 5C:
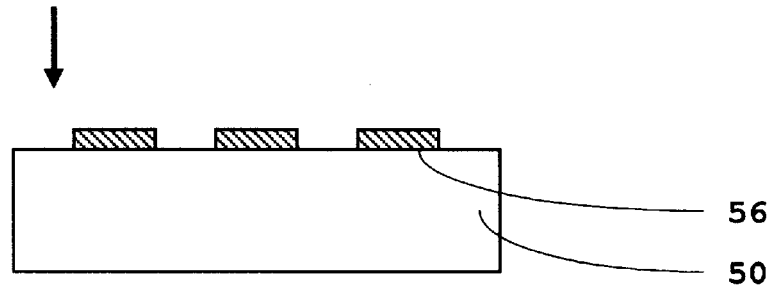

Referring now to FIG. 5, which shows in diagrammatic form another preferred process for making an elementary particle emitting surface having a geometrical shape for causing de Broglie interference, a substrate 50 having a pattern of resist 52 is made using electron beam lithography as described above in FIG. 4, steps (a) to (c). In step (b) a material 54, preferably a metal, is deposited onto the substrate using vapor deposition techniques well known in the art. Material 54 covers at least the exposed areas of substrate 50 as defined by the pattern. In step (c) the pattern is transferred to a substrate by removing pattern 52 and the parts of the second material 54 which lie above the pattern, whereby some of the second material 54 remains in a pattern of the shape of the spaces of the original pattern. Thus substrate 50 is exposed to a developing agent, which lifts off or dissolves remaining areas of the resist, and with this, is lifted off material 54 on top of resist 52, leaving raised areas 56 of material 54, giving the surface of substrate 50 a geometrical shape which causes de Broglie interference.

In a preferred embodiment, the substrate is silica. In another preferred embodiment, the substrate is diamond. In yet another embodiment, the substrate is gallium arsenide (GaAs).

Figure 6A:
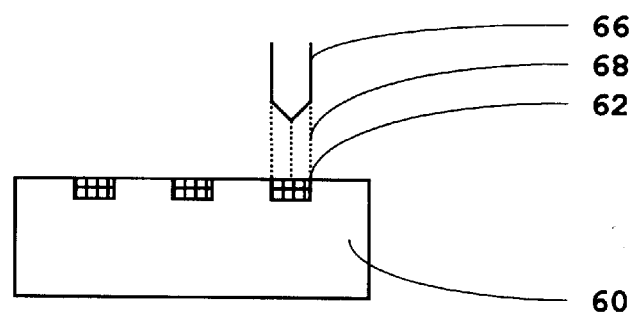
FIG. 6 (a,b) is a diagrammatic representation of an oxygen atom beam lithographic approach to the manufacture of a low work function surface.
Figure 6B:
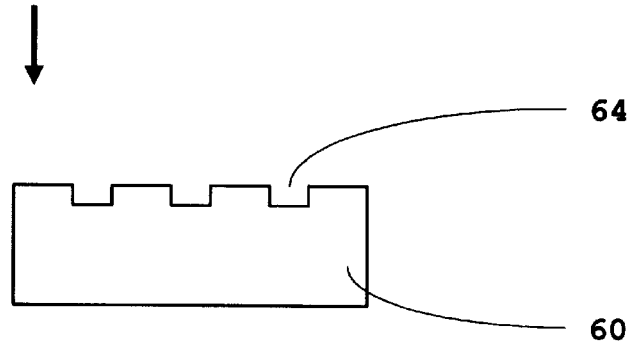

Referring now to FIG. 6, which shows in diagrammatic form a further preferred process for making an elementary particle emitting surface having a geometrical shape for causing de Broglie interference, a metal substrate 60 is exposed to an oxygen atom beam 68 from oxygen atom source 66, which creates a pattern of oxide 62 in the surface of the substrate (step (a)). In step (b) anisotropic etching of the oxide pattern 62 yields a series of pits 64, giving the surface of substrate 60 a geometrical shape which causes de Broglie interference.

Figure 7A:
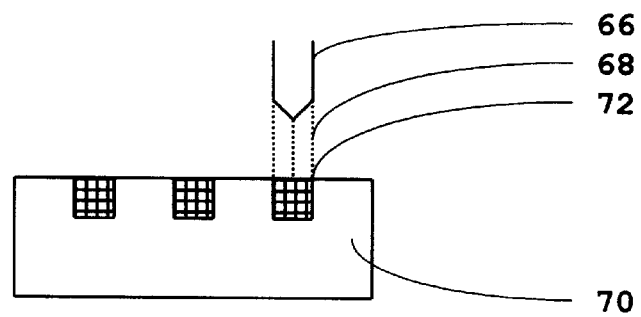
FIG. 7 (a,b) is a diagrammatic representation of an oxygen beam lithographic approach to the manufacture of a low work function surface, in which the surface is smooth.
Figure 7B:
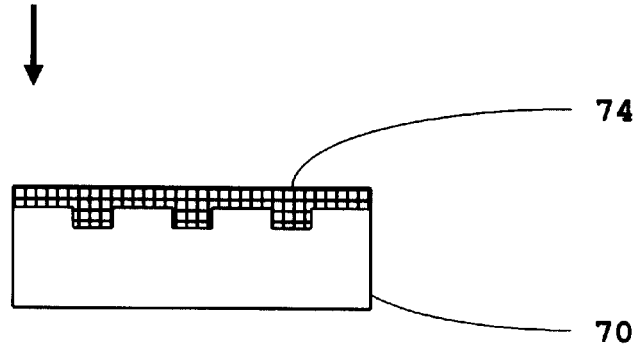

Referring now to FIG. 7, which shows in diagrammatic form a yet further preferred process for making an elementary particle emitting surface having a geometrical shape for causing de Broglie interference, a metal substrate 70 is exposed to an oxygen atom beam 68 from oxygen atom source 66, which creates a pattern of oxide 72 in the surface of the substrate (step (a)). This pattern is approximately twice the depth required for causing de Broglie interference. In step (b) isotropic oxidation of the surface yields a flat surface having indented oxide regions 74. The different energy distribution of oxide electrons creates a potential energy barrier of the sort described above, leading to the enhanced emission of electrons from the surface.

Any of the patterned substrates described above can be used as an electrode, or in a particularly preferred embodiment, the pattern on the substrate is created as the relief or "negative" of the pattern needed to cause de Broglie interference and used as a mold, stamper or roller for preparing large numbers of patterned substrates. This process is illustrated in FIG. 8.

Referring now to FIG. 8, step (a) shows a patterned substrate 40 produced according the process shown in FIG. 4, and a substrate 80 which has been coated with a resist layer 82 as shown in FIG. 4, step (a). Any of the other patterned substrates produced as described above may also be used. In step (b), patterned substrate 40 is used as the stamper or mold and is pressed into the surface of resist layer 82. In step (c), patterned substrate 40 is removed, leaving a pattern in resist layer 82. In step (d), substrate 80 is treated with a constant-rate etchant, which causes the formation of a pattern in the surface of substrate 80 giving the surface of substrate 80 a geometrical shape which causes de Broglie interference.

SUMMARY RAMIFICATIONS AND SCOPE

Thus the method for fabricating elementary particle-emitting surfaces described above produces surfaces in which the passage of elementary particles through a potential barrier is enhanced.

The invention should not be construed as limited to the specific embodiments and methods described above but should be seen to include equivalent embodiments and methods. For example, the polymer described above could be replaced by many materials that are affected by electron beams. Furthermore, the use of beams to create the required pattern can be implemented in many ways and not only as specifically described above. Etching may or may not take place, depending on the required method of transferal of the pattern "written" onto the polymer. The patterned substrate may form an electrode itself, or the pattern on it may be transferred to another material which may serve as an electrode, or may act as a mold from which electrodes are formed, or may even act as a mold for which molds to make electrons are formed.

Alternatively the mold is made of a higher melt material which is then stamped or rolled into a heated, softened lower melt material. Preferred materials are silica for the higher melt material and gold for the lower melt material.

Etching and lift-off methods as described above may be used for transferal of the pattern "written" into the resist to a substrate, or any technologies obvious in the art of pattern transferal. The substrate onto which resist is mounted when the pattern is "written" may or may not be the surface to which the pattern is transferred.

A yet further approach is to use a metal ion beam to build up surface structures.

I claim:

1. A process for making an elementary particle emitting surface, comprising the steps of:
    a. positioning into the path of a particle beam a layer of material whose molecules are modified when exposed to said particle beam,
    b. directionally focusing said particle beam on said material and exposing a pattern of molecules to the beam such that the modified molecules and the unmodified molecules of said material form a pattern that comprises an indented cross-section comprising protruding portions separated by spaces, and further wherein the depths of indents in said indented cross-section is given by the relationship $n\lambda+\lambda/4$, where $\lambda$ is the de Broglie wavelength for said elementary particles and where n is 0 or a positive integer selected such that the geometric shape of said indented cross-section causes de Broglie interference between said elementary particles,
    c. developing said material to remove either said modified molecules or said unmodified molecules, whereby molecules not removed by said developing form at least said protruding portions of said indented cross-section,
    d. transferring said pattern of said indented cross-section to a surface of a substrate whereby said indented cross-section is created on said substrate.

2. The process of claim 1 wherein said particle beam is an electron beam.

3. The process of claim 2 further comprising a step of mounting said material on said substrate prior to exposure of said material to said electron beam.

4. The process of claim 3 wherein said material comprises a polymer, and further wherein the step of mounting said polymer on said substrate comprises spin coating said polymer onto said substance.

5. The process of claim 4 wherein the step of transferring said pattern comprises transferring said pattern to a surface of said substrate beneath said polymer.

6. The process of claim 5 wherein the step of transferring said pattern to said substrate beneath said polymer comprises etching.

7. The process of claim 6 wherein said etching comprises an etching process selected from the group consisting of: chemical etching, isotropic etching, and anisotropic etching.

8. The process of claim 2 further comprising the step of mounting said material on said substrate prior to exposure of said material to said electron beam, wherein, after said exposure and said developing, said substrate is covered by said material except where said molecules of said material have been removed by said developing.

9. The process of claim 8 further comprising the step of depositing a second material on said material after developing said material, but prior to transferring said pattern, such that said second material covers at least the areas of said substrate which are not covered by said protruding portions of said indented cross-section.

10. The process of claim 9 wherein the step of transferring said pattern to said substrate comprises removing said protruding portions of said indented cross-section and the parts of said second material which lie above said protruding portions of said indented cross-section, whereby some of the second material remains in a pattern of the shape of the spaces between said protruding portions of said indented cross-section.

11. The process of claim 10 wherein said removing comprises a process selected from the group consisting of: chemical etching, isotropic etching, anisotropic etching, evaporating and dissolving.

12. The process of claim 1 wherein said particle beam is an oxygen atom beam.

13. The process of claim 12 wherein the step of transferring said pattern to said substrate is done by isotropically oxidizing said surface of said substrate.

14. The process of claim 1 additionally comprising the steps of:
    a. providing a second substrate coated with a polymer coat,
    b. pressing said substrate having said indented cross-section against said polymer coat on said second substrate,
    c. etching said second substrate using a constant rate etchant to yield a predetermined pattern on the surface of said second substrate.

15. The process of claim 1 additionally comprising the steps of:
    a. bringing said substrate having said indented cross-section into contact with a second substrate,
    b. applying pressure to said substrate having said indented cross-section, to cause said second substrate to have a surface having impressions corresponding to the protruding portions of said substrate having said indented cross-section.

16. The process of claim 15, wherein said second substrate has a melting temperature lower than said substrate having said indented cross-section, and additionally comprising the step of heating said second substrate, whereby said second substrate is softened.

17. The process of claim 15 additionally comprising the step of treating said second substrate with a hardening agent after said impressions have been formed, whereby said second substrate is hardened.

18. A process for preparing an elementary particle emitting surface having a geometrical shape for causing de Broglie interference between said elementary particles, comprising the steps of:

a. providing a metal substrate, b. etching said metal substrate by oxygen atom beam etching means to give an oxide pattern, c. dissolving said oxide to give a substrate having said predetermined lattice pattern.

19. A process for preparing an elementary particle emitting surface having a geometrical shape for causing de Broglie interference between said elementary particles, comprising the steps of:

a. providing a metal substrate, b. etching said metal substrate by oxygen atom beam etching means to give an oxide pattern, c. subjecting the substrate to isotropic oxidation, yielding a flat surface having indented oxide regions, which provide a potential energy barrier causing de Broglie interference between said elementary particles.

20. The process of claim 8, further wherein the step of transferring said pattern to said substrate comprises etching away said material and said substrate, wherein said etching etches deeper into said substrate in areas which are not covered by said protruding portions of said indents.

* * * * *